(12) United States Patent
Murray et al.

(10) Patent No.: US 6,918,984 B2
(45) Date of Patent: Jul. 19, 2005

(54) PHOTOCURABLE ADHESIVE COMPOSITIONS, REACTION PRODUCTS OF WHICH HAVE LOW HALIDE ION CONTENT

(75) Inventors: Helen M. Murray, Tipperary (IE); Jonathan P. Wigham, Dublin (IE); John E. Cahill, Kildare (IE); Aisling Lakes, Dublin (IE); Matthew J. Holloway, Kildare (IE); Eadaoin D. Ledwidge, Dublin (IE); Mary B. Ward, Dublin (IE)

(73) Assignee: Loctite (R&D) Limited, Dublin (IE)

( * ) Notice: Subject to any disclaimer, the term of this patent is extended or adjusted under 35 U.S.C. 154(b) by 445 days.

(21) Appl. No.: 10/176,648

(22) Filed: Jun. 24, 2002

(65) Prior Publication Data

US 2004/0006150 A1 Jan. 8, 2004

(51) Int. Cl.[7] .................................................. C08F 2/46
(52) U.S. Cl. ............................... 156/275.5; 156/275.7; 156/330
(58) Field of Search .......................... 156/272.2, 275.5, 156/275.7, 330; 522/8, 9, 16, 17, 70, 100, 168, 169, 170

(56) References Cited

U.S. PATENT DOCUMENTS

| | | | |
|---|---|---|---|
| 4,916,805 A | 4/1990 | Ellrich et al. .................. 29/832 |
| 5,550,265 A | 8/1996 | Castellanos et al. ........... 556/7 |
| 5,668,192 A | 9/1997 | Castellanos et al. .......... 552/31 |
| 5,721,289 A | * 2/1998 | Karim et al. .................. 522/31 |
| 5,721,451 A | 2/1998 | Settles et al. ................ 257/679 |
| 5,777,903 A | 7/1998 | Piosenka et al. ............. 364/700 |
| 5,863,970 A | 1/1999 | Ghoshal et al. .............. 523/434 |
| 6,129,955 A | * 10/2000 | Papathomas et al. ....... 427/517 |
| 6,147,184 A | 11/2000 | Castellanos et al. ........ 528/410 |
| 6,153,661 A | 11/2000 | Castellanos et al. .......... 522/31 |

FOREIGN PATENT DOCUMENTS

| | | | |
|---|---|---|---|
| WO | PCT/FR98/00566 | 10/1998 | ...................... 7/75 |
| WO | PCT/FR98/00741 | 10/1998 | ...................... 2/50 |

OTHER PUBLICATIONS

S.R. Kerr, III, "Next Generation UV Silicone Release Coatings", *Adh. Age*, p. 26–34 (Aug. 1996).

R. Möst, "Light–Curing Adhesives for Electronics", *Delo*, p. 1–7 (Undated).

R. R. Lathrop, Jr., "A Flexible Method for Applying Adhesives to Printed Circuit Boards", *Adh. Age*, (Dec. 1998).

* cited by examiner

*Primary Examiner*—John T. Haran
(74) *Attorney, Agent, or Firm*—Steven C. Bauman

(57) ABSTRACT

The present invention is directed to a photocurable composition for use as an encapsulant, for underfill or attachment adhesives, capable of curing at wavelengths greater than 290 nm. Reaction products of these photocurable compositions have a low level of extractable halide ion, such as less than 100 ppm. In use, the photocurable composition may be applied, for instance, over the wire bonds that electrically connect a semiconductor device to a substrate to maintain a fixed positional relationship and protect the integrity of the electrical connection from vibrational and shock disturbances, as well as from interference from environmental contaminants.

1 Claim, 1 Drawing Sheet

PHOTOCURABLE ADHESIVE COMPOSITIONS, REACTION PRODUCTS OF WHICH HAVE LOW HALIDE ION CONTENT

BACKGROUND OF THE INVENTION

1. Field of the Invention

The present invention is directed to a photocurable composition for use as an encapsulant, underfill or attachment adhesive, capable of curing at wavelengths greater than 290 nm. Reaction products of these photocurable compositions have a low level of extractable halide ion, such as less than 100 ppm and oftentimes less than 70 ppm. In use, the photocurable composition may be applied, for instance, over the wire bonds that electrically connect a semiconductor device to a substrate to maintain a fixed positional relationship and protect the integrity of the electrical connection from vibrational and shock disturbances, as well as from interference from environmental contaminants.

2. Brief Description of Related Technology

An integrated circuit assembly typically includes a substrate that forms a physical and structural foundation for an integrated circuit die, which itself is electrically connected to bonding pads on the substrate so as to allow for communication between the die and external devices.

In a smart card application, an integrated circuit module is disposed in a plastic card, similar in size and shape to an ordinary credit or debit card. The integrated circuit module itself includes a microcontroller and a memory device, such as an EPROM, of sufficient size to store large amounts of information, such as personal information, medical history information, financial information, security information, frequent flyer mileage information, and the like. The smart card can also operate as a telephone card with a stored monetary value that is updated with each transaction.

Heretofore, smart cards have included a plastic card, in which is milled out a pocket or cavity dimensioned and disposed to receive an integrated circuit module. The integrated circuit module is constructed of a die disposed over a substrate and electrically connected with gold or aluminum wire bonds. The wire bonds typically rise vertically from the die and bend over to a bonding pad on the substrate. (See FIG. 1.)

In order to protect the wire bonds from fracture or environmental damage, an encapsulant is ordinarily applied thereover. The encapsulant acts to seal in place the wire bonds, providing cushioning against shock (which may lead to fracture) and prevents the ingress of environmental contaminants which may cause an electrical disconnect.

One way to apply such an encapsulant during smart card assembly is by the so-called two-step "dam and fill" approach. Here, a dam is first cast from a highly thickened version of a lower-viscosity encapsulant, creating a wall around the device to be encapsulated. Alternatively, the device may be framed with a premolded wall or simply contained in a cavity that has been machined or fabricated into the board. See e.g., M. M. Konarski and J. Heaton, "Electronic Packaging Design Advances Miniaturization", *Circ. Assembly*, 32–35 (August 1996).

The encapsulant is ordinarily designed to have high flow characteristics, and through high filler loadings, to match to a large degree the coefficients of thermal expansion ("CTE") of the carrier substrate and the semiconductor device to which it is attached, by electrically-connecting wire bonds. The high flow characteristics—low viscosity—allows for easy penetration in and around ultrafine-pitch wire bond connection.

Once cured, these encapsulants should provide a high level of device reliability.

Early smart card encapsulants had been rendered curable through heat cure mechanisms. That is, after application of the encapsulant composition, cure would occur through exposure to elevated temperature conditions, such as about 100° C., for periods of time, such as about 16 hours. This would be ordinarily achieved through passage on line into a heating chamber. Products of this kind have been available commercially from Dexter Electronic Materials, City of Industry, California.

U.S. Pat. No. 5,863,970 (Ghoshal) speaks to heat curable epoxy resins of siloxane-based and non-siloxane-based epoxy resins, a filler, an iodonium salt cure catalyst and co-cure catalyst of a copper compound for use in electronic device assembly, such as die attach adhesives and encapsulants like underfill and glob top applications. More specifically, *Ghoshal* claims a filled resin composition whose components require a cycloalphatic epoxy-functional siloxane, a di-epoxy such as bis(3,4-epoxycyclohexyl) adipate, an iodonium salt whose counter ion may be pentafluoratetraphenyl borate, $B(C_6F_5)_4$, an optional copper compound, to lower the temperature required to thermally cure the composition, a silane-based adhesion promoter and a polybutadiene elastomeric toughener.

Drawbacks exist to such heat-cure encapsulants, though. For instance, the heat cure step may compromise the integrity of the overall electronic device and/or substrate by virtue of the thermal exposure. In addition, the heat cure step presents a discontinuity and drag in the manufacturing throughput, particularly in view of the heating and cooling required, as well as the time required to cure the encapsulant under such heated conditions. Moreover, energy and labor requirements involved in the heat cure step add cost to the assembly of the electronic device, such as the smart card.

As a result, there has been an on-going desire to find photocurable encapsulants, because photocure mechanisms are ordinarily more rapid than heat cure mechanisms, and occur without exposure to the heat applied during heat cure. Thus, use of such photocurable encapsulants minimizes the tendency to compromise the integrity of the overall electronic device and/or substrate.

Photocurable encapsulants, even for smart card applications, are not themselves new. However, the earlier developments of photocurable smart card encapsulants presented drawbacks—for instance, the high level of halide ion, such as fluoride ion, extractable from the cured encapsulant when placed in contact with moisture. High levels of such ions are believed by many smart card manufacturers to increase the possibility of corrosion (due to the formation of acid by virtue of moisture absorption, such as from the atmosphere or through mishandling). These halide ions are present for the most part from the cationic photoinitiator counter ion.

Many known cationic photoinitiators have as a counter ion a phosphorous or antimony metal complex with the appropriate number of fluorine atoms per metal atom. While such photoinitiators are very effective to initiate photocure, the counter ions of these photoinitiators are loosely bound moieties, which are readily extractable. As such, these counter ions tend to leach out from reactions product of the curable composition in which they are used and/or hydrolyze to liberate halide ions under exposure to moisture, such as from the atmosphere or otherwise. In the context of surface mount electronic component attachment, see U.S. Pat. No. 4,916,805 (Ellrich), which discloses certain photo-initiators having counter ions, such as $PF_6^-$, $BF_4^-$, $AsF_6^-$ and $SbF_6^-$.

Rhodia Chemie make available commercially a cationic photoinitiator for silicone-based release coatings, whose counter ion contains fluoride atoms covalently bound to aromatic carbon atoms of the counter ion, such as $B(C_6F_5)_4^-$. See International Patent Application Nos. PCT/FR97/00566 and PCT/FR98/00741. See also Rhone-Poulenc Chemie's U.S. Pat. No. 5,550,265 (Castellanos), U.S. Pat. No. 5,668,192 (Castellanos), U.S. Pat. No. 6,147,184 (Castellanos), and U.S. Pat. No. 6,153,661 (Castellanos).

However, Rhodia Chemie (or Rhone-Poulenc Chemie) has not taught, suggested or promoted such photoinitiators for use in photocurable adhesive or encapsulant compositions, particularly those based on epoxies, or recognized the low level of fluoride ion that is extractable from reaction products formed by initiation through such cationic photoinitiators. Rhodia Chemie has reported low levels of hexane extractable silicone from reaction products. See S. R. Kerr, III, "Next Generation UV Silicone Release Coatings", *Adh. Age*, p. 26–34 (August 1996).

Another drawback to known photocurable smart card encapsulants is the wavelength at which cure is designed to occur. That is, the memory device (or, EPROM) often used in smart card construction is particularly sensitive to wavelengths at 254 nm. At this wavelength, the EPROM may become erased. Therefore, current photocurable compositions that have been offered for sale as smart card encapsulants, but which cure at such wavelengths, are of limited utility.

Accordingly, the need exists for a photocurable composition, particularly well-suited for electronic component encapsulation applications, whose reaction products have low levels of extractable halide ion, and which may be designed to be curable at wavelengths greater than about 290 nm.

SUMMARY OF THE INVENTION

The present invention is directed to a photocurable composition for use as an encapsulant, underfill or attachment adhesive, which may be designed to cure upon exposure to radiation in the electromagnetic spectrum at wavelengths greater than about 290 nm and reaction products of which have a low level of extractable halide ion, such as less than 100 ppm and oftentimes less than 70 ppm. The composition includes an epoxy resin component, optionally, a photosensitizer, and a cationic photoinitiator, the counter ion of which includes at least one halide atom bound covalently to a carbon atom of the counter ion. Optionally, the inventive composition may include an adhesion promoter and/or an inorganic filler component.

The invention is also directed to methods of preparing such compositions, methods of using such compositions, assembly of microelectronic devices, such as smart cards, with such compositions, and reaction products of such compositions as well as the assembled microelectronic components.

The composition is particularly well-suited for use as an encapsulant for electronic components, as well as an underfill sealant, a potting composition a die attachment adhesive and an anisotropic conductive composition.

DETAILED DESCRIPTION OF THE INVENTION

Figure 1:
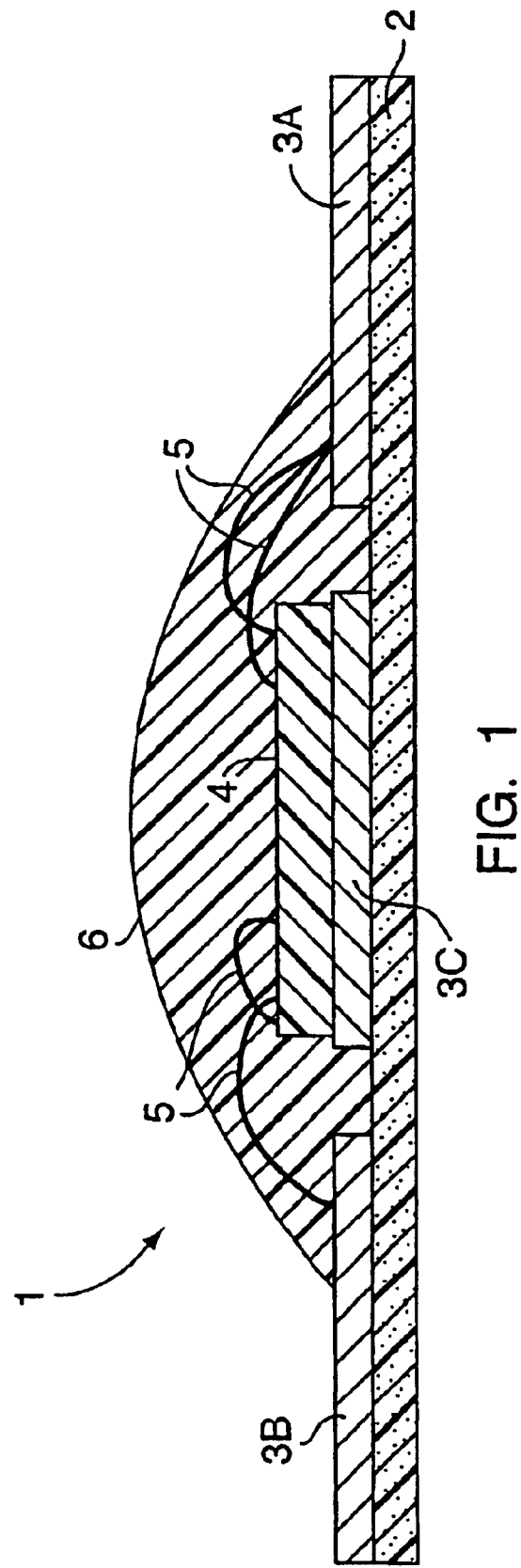
FIG. 1 is a cross-section view of a smart card with a wire bonded integrated circuit disposed therein.

As noted above, the inventive photocurable compositions are particularly useful as encapsulants for wire bonds, which electrically connect a semiconductor device to a carrier substrate. While for the most part the invention will be described in detail below with regard to its application as an encapsulant, such as an encapsulant for use in smart card assembly, those persons of skill in the art should readily recognize that many modifications and variations to the invention exist, rendering the invention appropriate for applications beyond encapsulation. Some of those applications are referred to above and in the examples.

The compositions include broadly an epoxy resin component, optionally, a photosensitizer component and a cationic photoinitiator component, the counter ion of which includes at least one halide atom bound covalently to a carbon atom of the counter ion. Optionally, the composition may include an adhesion promoter component and/or an inorganic filler component.

The photocurable composition of the present invention is capable of curing upon exposure to radiation in the electromagnetic spectrum having a wavelength greater than about 290 nm and reaction products of the composition have a low level of extractable halide ion, such as less than 100 ppm, and oftentimes less than 70 ppm.

It is significant to note that the compositions of the present invention may be designed to cure at a wavelength greater than about 290 nm. That is, in the context of encapsulating electronic components destined for use in connection with smart card assembly, the integrity of the EPROM could be compromised in the event that a wavelength of 254 nm (or in the near regions of 254 nm) is used to photocure the composition.

In addition, it is also significant to note that the covalently bound halide atom on the counter ion of the cationic photoinitiator allows for minimized, if not eliminated, potential for halide ion to leach out and/or become liberated due to hydrolysis from reaction products of the composition. Put another way, low levels of extractable halide ion are observed as a result.

The epoxy resin component of the present invention may include many common epoxy resins, such as those having multifunctionality.

Examples of such epoxy resins include cycloalphatic epoxy resins; $C_4$–$C_{28}$ alkyl glycidyl ethers; $C_2$–$C_{28}$ alkyl- and alkenyl-glycidyl esters; $C_1$–$C_{28}$ alkyl-, mono- and polyphenol glycidyl ethers; polyglycidyl ethers of pyrocatechol, resorcinol, hydroquinone, 4,4'-dihydroxydiphenyl methane (or bisphenol F), 4,4'-dihydroxy-3,3'-dimethyldiphenyl methane, 4,4'-dihydroxydiphenyl dimethyl methane (or bisphenol A), 4,4'-dihydroxydiphenyl methyl methane 4,4'-dihydroxydiphenyl cyclohexane, 4,4'-dihydroxy-3,3'-dimethyldiphenyl propane, 4,4'-dihydroxydiphenyl sulfone, and tris(4-hydroxyphyenyl)methane; polyglycidyl ethers of the chlorination and bromination products of the above-mentioned diphenols; polyglycidyl ethers of novolacs; polyglycidyl ethers of diphenols obtained by esterifying ethers of diphenols obtained by esterifying salts of an aromatic hydrocarboxylic acid with a dihaloalkane or dihalogen dialkyl ether; polyglycidyl ethers of polyphenols obtained by condensing phenols and long-chain halogen paraffins containing at least two halogen atoms; phenol novolac epoxy resins; cresol novolac epoxy resins; and combinations thereof.

Among the commercially available epoxy resins suitable for use herein are polyglycidyl derivatives of phenolic compounds, such as those available under the tradenames EPON 828, EPON 1001, EPON 1009, and EPON 1031, from Shell Chemical Co.; DER 331, DER 332, DER 334, and DER 542 from Dow Chemical Co.; GY285 from Ciba Specialty Chemicals; and BREN-S from Nippon Kayaku, Japan. Other suitable epoxy resins include polyepoxides prepared from polyols and the like and polyglycidyl derivatives of phenol-formaldehyde novolacs, the latter of which are available commercially under the tradenames DEN 431, DEN 438, and DEN 439 from Dow Chemical Company. Cresol analogs are also available commercially under the tradenames ECN 1235, ECN 1273, and ECN 1299 from Ciba Specialty Chemicals. The cycloaliphatic epoxy resin, UCB CAT-002, available commercially from UCB, is desirable as well. SU-8 is a bisphenol A-type epoxy novolac available from Shell Chemicals (formerly, Interez, Inc.). In addition, UVR-6105 and 6110 (each 3,4-epoxycyclohexylmethyl-3,4-epoxycyclohexane carboxylate) and UVR-6128 [(bis-(3,4-epoxycyclohexyl) adipate], each available commercially from UCB Chemicals, are desirable for use herein, with the latter being particularly desirable. And of course combinations of the different epoxy resins are also desirable for use herein.

Of the epoxy resins set forth above only those which are not basic in nature so as to quench cations are desirable for use herein.

As a photosensitizer, many suitable materials are available, though thioxanthones, like isopropyl thioxanthones are desirable. For instance, isopropyl thioxanthone is a suitable choice, as is diethyl-thioxanthone ("DETX"). In addition, other thioxanthones, such as 2-methyl-thioxanthone, 2,4-dichloro-thioxanthone, 2-chloro-thioxanthone, 2,4-dimethyl-thioxanthone, 2,4-diethyl-thioxanthone and 2,4-diisopropyl-thioxanthone may be used as well. Other photosensitizers particularly well suited for use with catonic photoinitiators include anthracene, perylene, phenothazine, 1,2 benzathracene, coronene, pyrene, and tetracene. Of course combinations of these photosensitizers may be used as well.

As the cationic photoinitiator, appropriate choices include those having a core cation within structure I below:

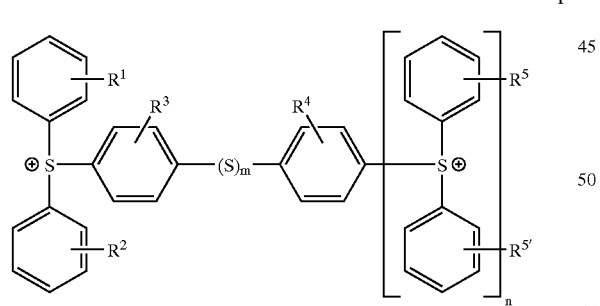

I where $R^1$, $R^2$, $R^3$, $R^4$, $R^5$ and $R^{5'}$ may or may not be present, but when not present are hydrogen and when any are present may individually be selected from $C_{1-6}$ alkyl, $C_{2-6}$ alkenyl, halogen, hydroxyl and carboxyl, with $R^1$, $R^2$, and $R^5$ being present individually up to 5 times on each aromatic ring to which it(they) is(are) attached, and $R^3$ and $R^4$ being present individually up to 4 times on each aromatic ring to which it(they) is(are) attached, n is 0–3 and m is 0–1.

More specific examples of cationic photoinitiators having core cations within structure I include those represented by structures II and III:

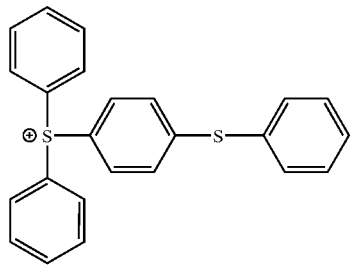

II

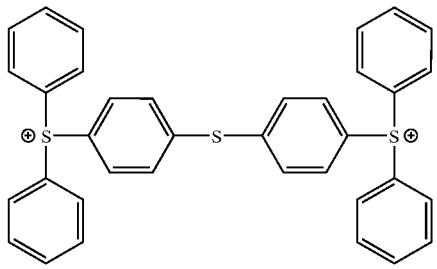

III

In addition, appropriate cationic photoinitiators include those having core cationswithin structures IV, V, and VI:

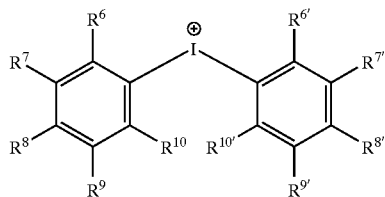

IV

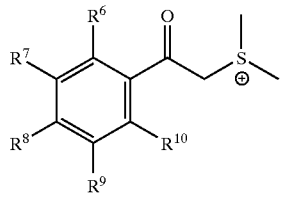

V

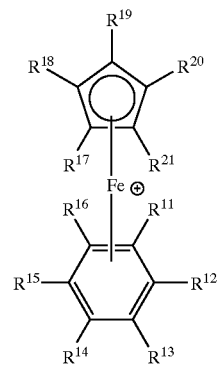

VI where for structures IV $R^6$, $R^7$, $R^8$, $R^9$ and $R^{10}$ may or may not be present, but when not present are hydrogen and when any are present may individually be selected from alkyl, such as from 1 to 5 carbon atoms, halogen, hydroxyl, and carboxyl, for structure V $R^6$, $R^7$, $R^8$, $R^9$, $R^{10}$, $R^{6'}$, $R^{7'}$, $R^{8'}$, $R^{9'}$, and $R^{10'}$ may or may not be present, but when not present are hydrogen and when any are present may individually be selected from hydrogen alkyl, such as from 1 to 5 carbon atoms, halogen, hydroxyl, and carboxyl, and for structure VI $R^{11}$, $R^{12}$, $R^{13}$, $R^{14}$, $R^{15}$, $R^{16}$, $R^{17}$, $R^{18}$, $R^{19}$, $R^{20}$, and $R^{21}$ may or may not be present, but when not present are hydrogen and when any are present may individually be selected from hydrogen alkyl, such as from 1 to 5 carbon atoms, halogen, hydroxyl, and carboxyl.

More specific examples of cationic photoinitiators having core cations within structure IV, V and VI include those represented by structures VII(a) and VII(b), VIII and IX, respectively:

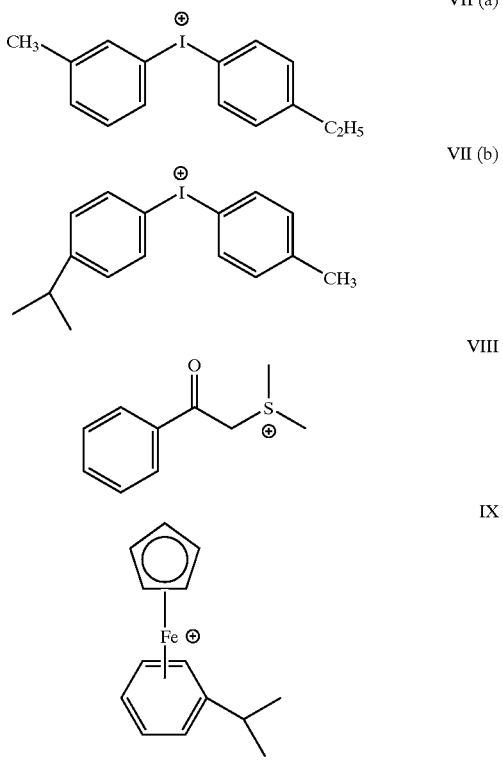

Structure VII(b) is the cationic portion of the photoinitiator called RHODOSIL 2074, commercially available from Rhodia Chemie, whose chemical name is tolylcumyl iodonium tetrakis(pentafluorophenyl)borate (CAS No. 178233-72-2).

Examples of the cationic photoinitiators include those commercially available from Sartomer, Exton, Pa. under the SARCAT® tradename, such as SARCAT® K185 [triarylsulfonium hexafluorophosphate (50% in propylene carbonate)]; SARCAT® SR1010 [triarylsulfonium hexafluoroantimonate (50% in propylene carbonate)]; and SARCAT® SR1012 (diaryliodonium hexafluoroantimonate). In addition, those available from Dow (formerly Union Carbide Chemicals) under the CYRACURE® tradename, such as UVI-6976 (mixed triarylsulfonium hexafluoroantimonate salts); UVI-6992 (mixed triarylsulfonium hexafluorophosphate salts); UVI-6974 and UVI-6990 are also useful. With these commercial cationic photoinitiators, the anionically bound counter ion, such as hexafluorophosphate is exchanged with a counter ion having covalently bound halide ions, rather than the loosely bound halides. For instance, halogenated tetraphenyl borates are desirable counter ions, particularly pentafluorotetraphenyl borate. Conventional ion exchange chemistry may be used to effect the change.

Where the core cation of the photoinitiator is an iodonium-containing cation, it is particularly desirable to include the photosensitizer.

As the adhesion promoter component, silanes, such as cycloaliphatic silanes [e.g., beta-3,4-epoxycyclohexyl ethyl trimethoxy silane] is commercially available from OSI under the trade designation A-186, epoxy silanes [e.g., glycidyl trimethoxysilane (commercially available from OSI under the trade designation A-187)], and amino silanes [e.g., gamma-amino propyl triethoxysilane (commercially available from OSI under the trade designation A-1100)] are desirable. In addition, trialkoxysilyl isocyanurate derivatives (e.g., Y-11597 from OSI) may also be used.

Typically, the composition includes up to about 98 weight percent, such as an amount within the range of about 45 weight percent to about 90 weight percent, for instance from about 35 to about 80 weight percent, desirably about 60 to about 75 weight percent, of the epoxy resin component by weight of the total composition, up to about 5 weight percent of the adhesion promoter component by weight of the total composition, up to about 5 weight percent, such as about 0.01 to about 2 weight percent of the cationic photoinitiator, by weight of the total composition and optionally up to about 1 weight percent, such as about 0.01 to about 1 weight percent, of a photosensitizer by weight of the total composition. Of course, depending on the particular set of properties desirable for a composition destined for a specific purpose these values may vary somewhat. Such variation may be achieved without undue experimentation by those persons of skill in the art.

An inorganic filler component may be useful in the inventive composition. The inclusion of an inorganic filler component allows for adjustments to the CTE of the encapsulant, so that it may be more closely matched to the substrate and microelectronic device with which it is to be used.

For instance, the inorganic filler component may often include reinforcing silicas, such as fused silicas, and may be untreated or treated so as to alter the chemical nature of their surface. Virtually any reinforcing fused silica may be used.

Particularly desirable ones have a low ion concentration and are relatively small in particle size (e.g., on the order of about 12 microns, with a median of up to about 30 microns and as low as less than about 2 microns), such as the Silbond materials, commercially available under the tradename SILBOND FW300EST from Quartzwerke, supplied by Sibelco, Belgium.

Other desirable materials for use as the inorganic filler component include those constructed of or containing aluminum oxide, silicon nitride, aluminum nitride, silica-coated aluminum nitride and micronmized quartz, provided they are not basic in nature.

Conductive—thermally and/or electrically—fillers may also be included in the inventive compositions. Examples of such fillers include silver, gold, nickel. A particularly desirable electrically conductive filler is gold, such as in the form of gold coated polymer spheres, particularly those having monodispersed diameters from 3 um to 50 um supplied commercially by Sekisui Chemicals Co., Ltd. Japan.

A plasticizer may also be included in the inventive composition to modify the glass transition temperature ("Tg") and modulus, examples of which include those available commercially from Union Carbide, such as under the trade designations TONE Polyol 301 and 310.

In addition, rheology modifiers, such as thickeners and thixotropes, like fumed silica, may be included in the inventive compositions.

The present invention also provides a method for the attachment of integrated circuits, such as smart card modules, to a carrier substrate, such as flex or smartcard tape, using the compositions so described. More specifically, the method includes the steps of applying such a composition to the carrier flex or smartcard tape, activating the composition prior to or after application thereof through exposure to radiation in the electromagnetic spectrum, such as a wavelength in a range of 200 to 600 nm, to such an extent that a desired initial tackiness is maintained and no skin formation on the surface of the composition occurs, positioning the integrated circuit onto the circuit board, and establishing electrical interconnections through wire bonds, and optionally, curing the composition at a temperature between about 60 and about 140° C., such as about 80° C.

Referring to FIG. 1, a cross-section view of a smart card module assembly 1 is shown, in which, a carrier substrate, such as a module carrier tape 2 (such as glass-reinforced epoxy), is contacted with bond pads 3A, 3B and 3C. Die 4 is positioned over bond pad 3C and wire connection 5 are established between die 4 and bond pads 3A and 3B. The inventive photocurable encapsulant composition 6 is dispensed as an encapsulant glob over smart card module assembly 1.

More specifically, the wire bonded semiconductor chip assembly is bonded face up onto the smart card tape with five wires attached from the bond point(s) on the semiconductor chip to the bond pad(s) on the smart card tape connections. These bonds and the faced up wire-bonded semiconductor chip assembly are protected from environmental and other contaminates, and mechanical stresses, by the inventive encapsulant composition. As noted, encapsulation may be achieved by glob, or by dam and fill for larger devices whose wires loop higher than those of smaller devices.

The inventive compositions are applicable to other integrated circuit assemblies where it is desirable to maintain a fixed positional relationship between a die and a substrate during processing through a photocure process, particularly where a memory device such as an EPROM is involved in the assembly, such as photocurable anisotropically conductive pastes and photocurable die attach materials.

The following examples are presented to further illustrate the invention, without intending to narrow or depart from its scope.

EXAMPLES

Example 1

In this example, certain cationic photoinitiators based on an iodonium core cation (structure IV), a sulfonium core cation (structure V), and a ferrocenium core cation (structure VI), counter ions of each of which include at least one halide atom (here, fluoride) bound covalently to a carbon atom of the counter ion, were prepared for evaluation as smart card encapsulants to demonstrate the low levels of extractable halide ion that may be observed from reaction products thereof. For comparative purposes, smart card encapulants were prepared with cationic photoinitiators having counter ions with anionically-bound halide. Sample Nos. 1, 3 and 5 were prepared using a photoinitiator having a counter ion whose halide atoms are covalently bound, a tetrapentafluorophenyl borate counter ion, whereas Sample Nos. 2, 4 and 6 were prepared using a photinitiator having a counter ion whose halide ions are anionically bound. The constituents of these samples containing the noted cationic photoinitiators are set forth below in Tables 1a–1c.

TABLE 1a

| Component | | |
|---|---|---|
| Type | Identity | Weight % |
| Sample No. 1 -- Iodonium B(C$_6$F$_5$)$_4$ | | |
| Epoxy | Bis-(3,4-epoxycyclohexyl) adipate | 60.47 |
| | Cycloaliphatic epoxy resin | 36.16 |
| Adhesion promoter | Gamma-glydoxypropyl trimethoxy silane | 2.85 |
| Photosensitizer | Isopropyl thioxanthone | 0.02 |
| Photoinitiator | Iodonium B(C$_6$F$_5$)$_4$ | 0.50 (0.52 mmoles) |
| Result (ppm of F$^-$ in cured formulation) = 5.88 ppm | | |
| Sample No. 2 -- Iodonium SbF$_6$ | | |
| Epoxy | Bis-(3,4-epoxycyclohexyl) adipate | 60.82 |
| | Cycloaliphatic epoxy resin | 36.08 |
| Adhesion Promoter | Gamma-glydoxypropyl trimethoxy silane | 2.82 |
| Photosensitizer | Isopropyl thioxanthone | 0.02 |
| Photoinitiator | Iodonium SbF$_6$ | 0.26 (0.26 mmoles) |
| Result (ppm of F$^-$ in cured formulation) = 39.20 ppm | | |

In Table 1a, the photoinitiator for Sample No. 1 is (tolycumyl) iodonium tetrakis(pentafluorophenyl)borate. For Sample No. 2, the photoinitiator is diphenyliodonium hexafluoroantimonate.

TABLE 1b

| Component | | |
|---|---|---|
| Type | Identity | Weight % |
| Sample No. 3 -- Sulfonium B(C$_6$F$_5$)$_4$ | | |
| Epoxy | Bis-(3,4-epoxycyclohexyl) adipate | 56.84 |
| | Cycloaliphatic epoxy resin | 38.32 |
| Adhesion Promoter | Gamma-glydoxypropyl trimethoxy silane | 2.87 |
| Photoinitiator | Sulfonium B(C$_6$F$_5$)$_4$ | 1.97 (2.29 mmoles) |
| Result (ppm of F$^-$ in cured formulation) = 10 ppm | | |
| Sample No. 4 - Sulfonium SbF$_6$ | | |
| Epoxy | Bis-(3,4-epoxycyclohexyl adipate | 57.42 |
| | Cycloaliphatic epoxy resin | 38.72 |
| Adhesion Promoter | Gamma-glydoxypropyl trimethoxy silane | 2.90 |
| Photoinitiator | Sulfonium SbF$_6$ | 0.96 (2.29 mmoles) |
| Result (ppm of F$^-$ in cured formulation) = 1002 ppm | | |

In Table 1b, the photoinitiator for Sample No. 3 is dimethyl phenylacyl sulfonium tetrakis(pentafluorophenyl) borate, and for Sample No. 4 the photoinitiator is dimethylphenylacyl sulfonium hexafluorantimonate.

TABLE 1c

| Component | | |
|---|---|---|
| Type | Identity | Weight % |
| Sample No. 5 -- Ferrocenium B(C$_6$F$_5$)$_4$ | | |
| Epoxy | Bis-(3,4-epoxycyclohexyl adipate | 57.49 |
| | Cycloaliphatic epoxy resin | 38.31 |
| Adhesion Promoter | gamma-glydoxypropyl trimethoxy silane | 2.97 |
| Photoinitiator | Ferrocenium B(C$_6$F$_5$)$_4$ | 1.22 (1.35 mmoles) |
| Result (ppm of F$^-$ in cured formulation) = 70 ppm | | |
| Sample No. 6 -- Ferrocenium PF$_6$ | | |
| Epoxy | Bis-(3,4-epoxycyclohexyl) adipate | 57.90 |
| | Cycloaliphatic epoxy resin | 38.58 |
| Adhesion Promoter | Gamma-glydoxypropyl trimethoxy silane | 3.00 |
| Photoinitiator | Ferrocenium PF$_6$ | 0.52 (1.35 mmoles) |
| Result (ppm of F$^-$ in cured formulation) = 2234 ppm | | |

In Table 1c, for Sample No. 5 the photoinitiator is ferrocenium tetrakis(pentafluorophenyl)borate, and for Sample No. 6 photoinitiator is ferrocenium hexafluoroprosphene, commercially available as IRGA-CURE 261 from Vantico, Inc.

In Table 1a, Sample Nos. 1 and 2 were prepared with a photosensitizer, isopropyl thioxanthone, to initiate photolysis in the 350 nm region. In contrast, in Tables 1b and 1c, Sample Nos. 3–6 were prepared without a photosensitizer. The iodonium-based photoinitiators shown in Table 1a use a photosensitizer to shift the wavelength of photolysis. The sulfonium- and ferrocenium-based photoinitiators used in these samples absorb radiation at a wavelength of 310 nm; 310 nm is greater than 290 nm and sufficiently away from 254 nm so as not to raise a concern about EPROM erasure in smart card assembly.

The samples were prepared using conventional techniques, dispensed onto glass, and cured using an Oriel lamp as a UV light source having an intensity of 850 mW/cm$^2$ for a period of time which varied from about 2 seconds to about 35 seconds, depending on the identity of the photoinitiator.

As can be seen from each of Tables 1a–1c, the amount of fluoride ion that was extracted from reaction products of the smart card encapsulants is dramatically less in each of Sample Nos. 1, 3 and 5 as contrasted to Sample Nos. 2, 4, and 6, respectively.

The samples set forth in each of Tables 1a–1c were evaluated for tack free time as well. Table 1d sets forth the tack free time observations when exposed to the UV light source above. The samples were evaluated in triplicate, and the observations presented are the upper and lower values of those evaluated.

TABLE 1d

| Physical Property | Sample No./(Secs.) | | | | | |
|---|---|---|---|---|---|---|
| | 1 | 2 | 3 | 4 | 5 | 6 |
| Tack Free Time | 1.9–2.3 | 13.1–13.8 | 6.4–7.1 | 10.2–10.6 | 21–24 | 32–35 |

Sample Nos. 1, 3 and 5 demonstrate a pronounced percentage based improvement in speed of establishing tack free times, as contrasted to Sample Nos. 2, 4, and 6, respectively.

Example 2

In this example, Sample Nos. 7 and 8 were prepared with the components and amounts identified below in Table 1a for the purpose of determining whether and to what extent a composition prepared with a cationic photointiator with a counter ion having covalently bound fluoride ion would cure through volume ("CTV") when exposed to UV light, and comparing such a composition with one prepared with a photoinitiator having ionically bound fluoride ion.

TABLE 2a

| Components | | Sample No./(wt. %) | |
|---|---|---|---|
| Type | Identity | 7 | 8 |
| Epoxy | Bis-(3,4-epoxycyclohexyl) adipate | 76.2 | 76.2 |
| Adhesion Promoter | gamma-glydoxypropyl trimethoxy silane | 2.87 | 2.87 |
| Photoinitiator | Diaryl iodonium, tetrakis(penta fluorophenyl)borate | — | 2.16 |
| | Mixed triaryl sulfonium hexafluoroantimonate | 2.16 | — |
| Plasticizer | Castor oil derivative | 19.39 | 19.39 |

The CTV after exposure to UV light of an intensity of 100 mW/cm$^2$ from a UVALOC 1000 for the period of time noted is set forth below in Table 1b.

TABLE 2b

| Time | Sample No./CTV (mm) | |
|---|---|---|
| (secs) | 7 | 8 |
| 10 | — | — |
| 15 | 4.1 | Skin |
| 20 | 4.1 | 1.93 |
| 30 | >4.6 | 2.72 |
| 40 | >4.6 | 3.51 |

Based on these results, it is clear that use of a cationic photoinitiator having a counter ion with covalently-bound fluoride cures through volume (Sample No. 8), though not to the same extent as use of a more conventional cationic photoinitiator having a counter ion with anionically-bound fluoride.

Example 3

This example illustrates the benefits of inclusion of a photosensitizer, which shifts the wavelength absorption point to about 365 nm, as the H$_2$ filter blocks all light at a wavelength of 290 nm and below.

In this example, Samples Nos. 9 and 10 were prepared with the components in the relative amounts identified below in Table 3a for the purpose of determining whether and to what extent samples prepared with a cationic photoinitiator having a counter ion with covalently bound fluoride would cure when exposed to filtered UV light (through a $H_2$ filter) for a period of time of 10 seconds. This filter blocks all light at a wavelength of 290 nm and below, and hence only light above 290 nm passes through for exposure to the sample.

TABLE 3a

| Components | | Sample No./(parts) | |
|---|---|---|---|
| Type | Identity | 9 | 10 |
| Epoxy | UVR 6128 | 75.44 | 75.44 |
|  | UCB CAT 002 | 45.24 | 45.24 |
| Adhesion Promoter | gamma-Glydoxypropyl trimethoxy silane | 1.63 | 1.63 |
| Photoinitiator | Diaryl iodonium, tetrakis(penta fluorophenyl)borate | 0.57 | 0.57 |
| Photosensitizer | Isopropyl thioxanthone | 0.06 | — |

As can be seen from Table 3a, Sample Nos. 9 and 10 differ only in the presence of the photosensitizer in Sample No. 9, the presence of which allows cure to occur even without exposure to light at 254 nm or thereabouts. That is, the presence of the photosensitizer allows cure to occur at 290 nm and above.

The results in Table 3b below indicate that the presence of the photosensitizer, promotes cure after exposure to UV light through a $H_2$ filter, whereas without the photosensitizer the sample did not cure.

TABLE 3b

| Time | Sample No./CTV (mm) | |
|---|---|---|
| (secs) | 3 | 4 |
| 10 | 2.48 | — |

TABLE 4a

| Components | | Sample No./(wt. %) | | |
|---|---|---|---|---|
| Type | Identity | 11 | 12 | 13 |
| Epoxy | UVR 6128 | 34.89 | 34.89 | 34.89 |
|  | UCB CAT 002 | 20.92 | 20.92 | 20.92 |
| Adhesion Promoter | gamma-Glydoxypropyl trimethoxy silane | 1.63 | 1.63 | 1.63 |
| Photoinitiator | Diaryl iodonium, tetrakis(penta fluorophenyl)borate | 0.57 | — | 0.19 |
|  | Mixed triaryl sulfonium hexafluoroantimonate | — | 0.57 | — |
| Photosensitizer | Isopropyl thioxanthone | 0.06 | — | 0.01 |
| Inorganic filler | Micronized quartz | 42 | 42 | 42 |

Sample Nos. 11–13 were each used as a smart card encapsulant, where the smart card assembly is exposed to a number of different lighting conditions during assembly. To simulate these lighting conditions, a series of filters were used to block light of certain intensities. The BL filter blocks all light except that within the range of 320–400 nm; the $H_1$ filter blocks all light below 310 nm; and as noted above the $H_2$ filter blocks all light below 290 nm.

The results shown below in Table 4b indicate that the CTV achieved with the addition of the cationic photoinitiator used in the inventive composition (Sample No. 13) compared well with a conventional formulation useful as a smart card encapsulant (Sample No. 12).

TABLE 4b

| | Sample No./Filter Type/CTV (mm) | | | | | | | | | | | |
|---|---|---|---|---|---|---|---|---|---|---|---|---|
| Time | 11 | | | | 12 | | | | 13 | | | |
| (secs) | None | BL | $H_1$ | $H_2$ | None | BL | $H_1$ | $H_2$ | None | BL | $H_1$ | $H_2$ |
| 5 | 0.67 | — | — | — | 1.07 | 0.4 | 0.91 | 0.86 | 1.11 | — | — | — |
| 15 | 2.8 | 0.91 | 2.11 | 2.3 | 2.09 | 0.61 | 1.80 | 1.74 | 3.13 | 1.66 | — | — |
| 30 | 3.18 | 2.44 | 3.68 | 3.49 | 2.31 | 0.97 | 2.55 | 2.52 | 4.37 | 2.7 | — | — |

Example 4

This example illustrates the benefits of reducing the amount of photoinitiator and photosensitizer. In Sample Nos. 11 and 13, as well as in comparison to conventional photocurable encapsulant compositions (in Sample Nos. 12 and 13).

Thus, in this example, Sample Nos. 11, 12 and 13 were prepared with an inorganic filler component, in this case micronized quartz was added to assist in CTE matching when the samples are used to assemble microelectronic devices. In these samples, the components in the relative amounts are identified below in Table 4a.

Moreover, the reduction of the level of extractable fluoride ion was measured from the cured products of Sample Nos. 11, 12, and 13 by high temperature reflux extraction in deionized water for a period of time of 16 hours, followed by ion exchange chromatography using a Dionex ion pack column A515 packed with an amounted divinyl benzene matrix with 38 mN NaOH as an eluant. The level of extractable fluoride ion for Sample No. 11 was determined to be 36 ppm, which is nearly a ten-fold improvement over the 300 ppm level observed from a conventional smart card encapsulant (Sample No. 12).

The reduction of the photoinitiator in Sample No. 13 to 0.19 weight percent from 0.57 weight percent in Sample No.

11 demonstrated a further improvement in the reduction of extractable fluoride ion from 36 ppm to 10 ppm.

Example 5

UV ACP

In a photocurable anisotropically conductive paste ("ACP") application, the quartz filler was replaced with gold coated polymer particles as conductive particles. The ACPs are suitable for use with at least one UV light transmitting substrate is present so that radiation may reach the ACP dispensed between then pair of substrates, if the radiation source is positioned properly. A commercial application of such UV ACPs is flexible circuit to liquid crystal displays. Sample No. 14 was prepared from the listed components in the noted amounts.

TABLE 5

| Component | | Sample No./(wt. %) |
|---|---|---|
| Type | Identity | 14 |
| Epoxy | Bis-(3,4-epoxycyclohexyl) adipate | 57.2 |
|  | Cycloaliphatic epoxy resin | 34.3 |
| Adhesion Promoter | gamma-glydoxypropyl trimethoxy silane | 2.63 |
| Photoinitiator | Diaryl iodonium, tetrakis(penta fluorophenyl)borate (RHODOSIL 2074) | 0.92 |
| Photosensitizer | Isopropyl thioxanthone | 0.095 |
| Conductive Filler | Gold particles | 4.75 |

The assembly was produced on a Finetech flip chip bonder with an application pressure of about 20 Newtons (based on chip area). The assembly was cured through the glass substrate of the assembly for a period of time of about 30 seconds using an EFOS Ultracore 100SS Plus lamp. The average contact resistance was determined to be 3.8 KOhm.

Example 6

UV Die Attachment Adhesive

In a UV die attachment adhesive application for smart cards, the UV die attachment adhesive (Sample No. 15) as set forth in Table 6 below, was dispensed where the die will be sitting.

TABLE 5

| Component | | Sample No./(wt. %) |
|---|---|---|
| Type | Identity | 15 |
| Epoxy | Bis-(3,4-epoxycyclohexyl) adipate | 60.84 |
|  | Cycloaliphatic epoxy resin | 36.07 |
| Adhesion Promoter | gamma-glydoxypropyl trimethoxy silane | 2.84 |
| Photoinitiator | Diaryl iodonium, tetrakis(penta fluorophenyl)borate (RHODOSIL 2074) | 0.26 |
| Photosensitizer | Isopropyl thioxanthone | 0.02 |

The die attachment adhesive was exposed to UV radiation from an Oriel Model No. 71446, equipped with a UV Xenon Arc Lamp, for 400 msecs at an intensity of 450 mW/cm$^2$, with an open time of 2–3 seconds to photoactivate the adhesive. The die was then placed on the photoactivated die attachment adhesive. Cure of the die attachment adhesive occurred promptly after the die was placed thereover. The assembly may then be exposed to 110° C. for 1 minute and/or further UV radiation.

The UV die attachment adhesive once cured demonstrated acceptable die shear strength measurements.

Example 7

In a UV ACP application, the ACP may be exposed to a high energy light source, such as an EFOS Ultracore 100SS Plus lamp prior to assembly of a flip-chip or flex circuit. In this instance, the ACP may be used where both substrates are constructed from a material that is not substantially radiation transmissive. The radiation exposure is ordinarily on the order of msecs, and to the extent a post cure is desired, the temperature chosen may be as low as about 80° C. Thus, this assembly process is suitable for temperature sensitive substrates. In Table 7 below, Sample No. 16 was prepared as a UV ACP with the components and the amounts noted.

TABLE 7

| Component | | Sample No./(wt. %) |
|---|---|---|
| Type | Identity | 16 |
| Epoxy | Bis-(3,4-epoxycyclohexyl) adipate | 56.0 |
|  | Cycloaliphatic epoxy resin | 33.6 |
| Adhesion Promoter | gamma-glydoxypropyl trimethoxy silane | 2.57 |
| Photoinitiator | Diaryl iodonium, tetrakis(penta fluorophenyl)borate (RHODOSIL 2074) | 0.90 |
| Photosensitizer | Isopropyl thioxanthone | 0.093 |
| Conductive Filler | Gold particles | 4.90 |
| Thixotrope | Fumed Silica | 1.94 |

Sample No. 16 as prepared was dispensed through a screen printing procedure onto a FR4 anistropic conductive adhesive test piece. The conductive tracks on the test piece are constructed from gold. The bumps of a flip-chip were aligned with the gold tracks on the FR4. Sample No. 16 was then exposed to UV light for 200 milliseconds, from an EFOS Ultracure 100SS Plus lamp. The intensity measured at 310 nm and 365 nm, was 225 mW/cm$^2$ and 100 mW/cm$^2$, respectively. The die was then held in place for 5 seconds under 40 N pressure. The resistance was then measured and the average figures over 24 readings and two sample test pieces were recorded. The averages on the test pieces were: 0.47 and 0.67 KOhm.

Sample No. 16 was then screen printed onto ITO-coated glass test pieces. The alignment, UV exposure and pressure application was performed as above, and the resistance measurements taken as above. The average resistances was: 3.6 KOhm on each test piece.

While specific embodiments of the present invention have been shown and described, further modifications and improvements will become readily apparent to those skilled in the art. As such, the invention is not limited to the particular embodiments shown and described, and therefore the claims are intended to cover all such modifications and improvements which do not depart from the spirit and scope of this invention.

What is claimed is:

1. A method for the attachment of an integrated circuit to a carrier substrate, the steps of which include applying a photocurable composition to the carrier substrate, wherein the photocurable composition curable under exposure to radiation in the electromagnetic spectrum, reaction products of which have a low level of extractable halide ion, and comprises:

(i) an epoxy resin component, (ii) optionally, a photosensitizer and (iii) a cationic photoinitiator, the counter ion of which includes at least one halide atom bound covalently to a carbon atom of the counter ion;

activating the composition prior to or after application thereof through exposure to radiation in the electromagnetic spectrum;

positioning the integrated circuit onto the circuit board and establishing electrical interconnection therebetween; and optionally, curing the composition at a temperature between 60 and 140° C.

* * * * *